United States Patent [19]

Ono et al.

[11] 4,253,061
[45] Feb. 24, 1981

[54] LIGHT CONVERTING TYPE DETECTORS

[75] Inventors: Toshiharu Ono; Sensaku Ikeda, both of Tokyo, Japan; Hideo Ohno, 629, Ohshiba, Mobara City, Chiba Prefecture, Japan

[73] Assignees: Goro Eto; Hideo Ohno, both of Mobara, Japan

[21] Appl. No.: 961,283

[22] Filed: Nov. 16, 1978

Related U.S. Application Data

[63] Continuation of Ser. No. 629,320, Nov. 6, 1975, abandoned.

[30] Foreign Application Priority Data

Nov. 9, 1974 [JP] Japan ................... 49-129457

[51] Int. Cl.³ .................. G01R 31/00; G01R 7/00
[52] U.S. Cl. ...................... 324/96; 250/225; 324/142
[58] Field of Search .............. 324/96, 133, 142; 250/225, 227 R; 455/615, 616

[56] References Cited

U.S. PATENT DOCUMENTS

| | | | |
|---|---|---|---|
| 3,363,174 | 1/1968 | Hudson et al. | 324/96 |
| 3,425,049 | 1/1969 | Robinson | 324/133 |
| 3,543,151 | 11/1970 | Pelenc et al. | 324/96 |
| 3,675,125 | 7/1972 | Jaecklin | 324/96 |

*Primary Examiner*—Ernest F. Karlsen
*Attorney, Agent, or Firm*—Charles E. Pfund

[57] ABSTRACT

In a high voltage or current detector of the type utilizing an insulating tube, polarized light is directed to a photoelectric element mounted on the upper end or contained in the insulating tube so as to modulate the polarized light in accordance with the voltage or current to be measured. The modulated light is directed to a photosensitive element on the lower end of the tube for producing an electric signal which is applied to a meter for displaying the voltage or current.

18 Claims, 8 Drawing Figures

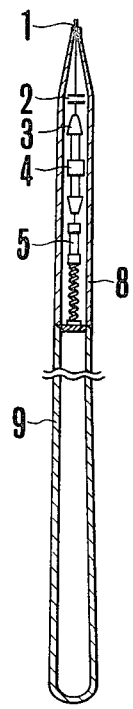
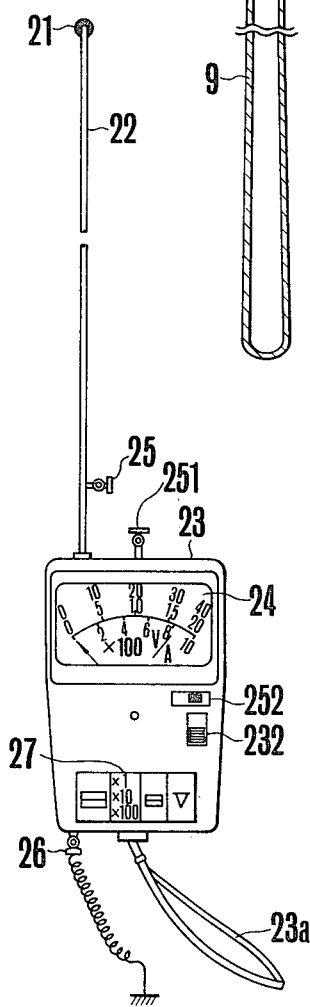
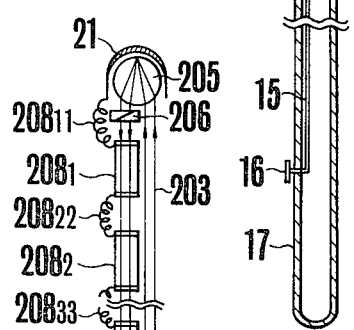
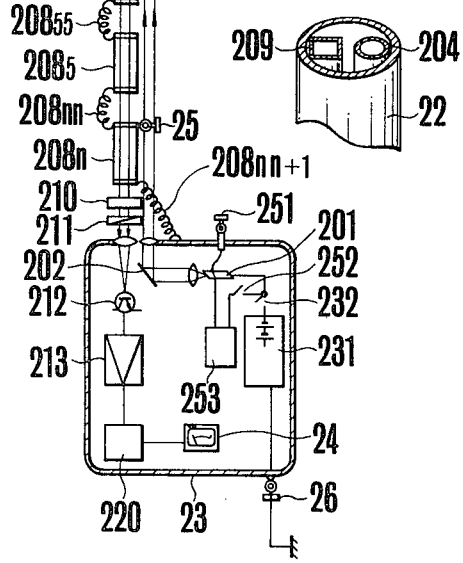
FIG.1 PRIOR ART
FIG.2 PRIOR ART
FIG.3
FIG.4
FIG.4A

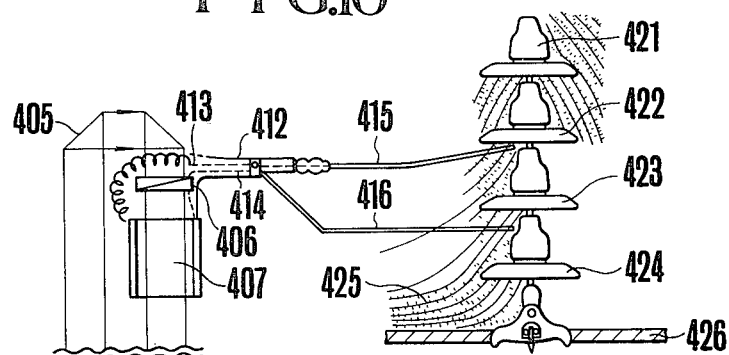
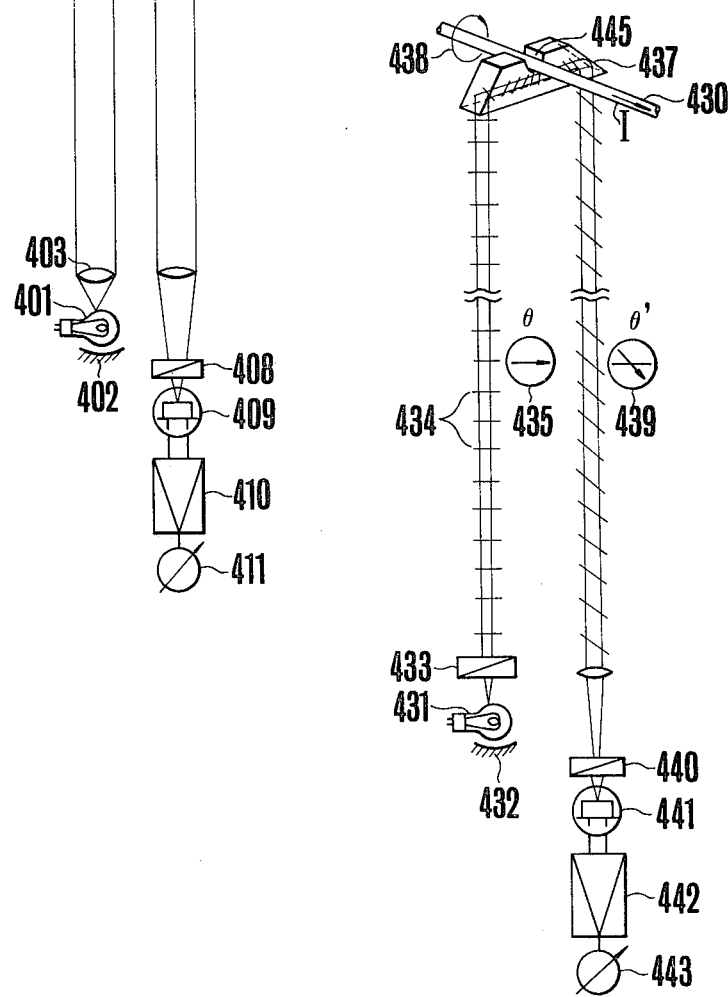

LIGHT CONVERTING TYPE DETECTORS

This is a continuation, of application Ser. No. 629,320 filed Nov. 6, 1975, now abandoned.

BACKGROUND OF THE INVENTION

This invention relates to a light converting type detector, more particularly, to a detector capable of detecting whether a direct current or alternating current high voltage line or electric machines or apparatus are impressed or i.e. not with a potential, or alive or dead, and if they are alive, capable of detecting the magnitude of the voltage or current.

The type, construction and operation of conventional detectors are different depending upon the rated voltage of the electric transmission and distribution lines or electric machines and apparatus. However, those using neon tubes providing visual indications and acoustic type producing sound pulses are used in most cases for confirming whether an electric circuit, machine or apparatus or installation are alive or dead.

However many people die every year due to electric shocks even when such detectors are used and even when they work under safety regulations, because it is impossible to visually confirm presence of high potential.

As shown in FIG. 1, a conventional neon tube type detector comprises an insulating tube 8 made of ebonite, for example, and an insulating operating rod 9. The insulating tube 8 contains a contact piece 1, a capacitor 2, a neon tube 3 and a resistor 5 which are connected in series. When the contact piece 1 is brought near a live portion, a fraction of the voltage thereof is detected through capacitor 2. Neon tube 3 is provided with a view window 4 made of a plastic lens for ready observation. However, such detector can be used in a relatively narrow voltage range of from 100 to several tens thousand volts because in a strong electric field, the neon tube 3 lights before actually contacting the contact piece 1 to a live element. Moreover, it is difficult to see whether the neon tube 3 lights or not because it is mounted on the long insulating rod.

FIG. 2 shows another type of the prior art detector wherein a clip current transformer type AC current meter mounted on an insulating rod 17 is used to measure the current I flowing through a high voltage conductor 10. This detector is constructed to detect the current I flowing through conductor 10 by detecting the magnetic flux produced by the current I by a current transformer 13 formed by a clip 12. The opening and closing of the clip is performed by a knob 16 located near the lower end of the hollow insulating rod 17 through a rod 15 extending through the insulating rod 17. If this type of the detector is used to measure current I flowing through a high voltage conductor, it is difficult to read ammeter 14 because of the length of the insulating rod. Locating the ammeter 14 at a lower portion is not permissible because of the danger of the high voltage. To obviate such difficulties it has been proposed to convert the measured current into an audible pulse which is transmitted through a pipe to be converted into an electric signal for operating an ammeter at a lower position. However, such construction is complicated and not yet used.

SUMMARY OF THE INVENTION

Accordingly, it is the principal object of this invention to provide a novel light converting type detector capable of readily measuring high voltage or high voltage current.

Another object of this invention is to provide a safe light converting type detector of less danger of electric shock.

Still another object of this invention is to provide a light converting type detector capable of readily measuring the potential distribution of a charged body for example the voltage share of each insulator of a string insulator or the potential distribution of the bushing or the connector of a high voltage machine or apparatus.

A further object of this invention is to provide an improved light converting type detector not using a clip member adapted to encircle a conductor, in other words, one which can measure the current flowing through the conductor by merely contacting the same.

Still further object of this invention is to provide a versatile light converting type detector capable of measuring voltage and current.

Generally speaking, in accordance with this invention, in a high voltage or current detector of the type utilizing an insulating tube, polarized light is directed to a photosensitive element mounted on the upper end or contained in the insulating tube so as to modulate the polarized light in accordance with the voltage or current to be measured. The modulated light is directed to a photosensitive element on the lower end of the tube for producing an electric signal for displaying the voltage or current.

According to one embodiment of this invention there is provided a light converting type detector comprising an insulating tube, a source of light located beneath the insulating tube, a reflector mounted on the upper end of the tube, means for projecting the light emitted by the source of light upon the reflector to cause the same to reflect back the projected light, a polarizer for polarizing the light, a photoelectric element contained in the insulating tube for modulating the polarized light in accordance with an electric quantity to be measured, means located on the top of the tube for deriving out the electric quantity from a charged member and for applying the electric quantity to the photoelectric element, means located beneath the tube for converting the modulated light produced by the photoelectric element into an electric signal and means responsive to the electric signal for displaying the electric quantity.

According to another embodiment of this invention, there is provided a detector comprising a source of light, a polarizer for polarizing the light emitted by the source of light, a Faraday rotator also acting as a prism reflector, the Faraday rotator causing the polarized light to undergo Faraday rotation by the magnetic field produced by electric current to be measured, photoelectric converting means for converting the rotated light into an electric signal and means responsive to the electric signal for displaying the current.

According to still another embodiment, these two types of detectors are combined to measure the current and voltage of a high voltage transmission line, electric machine or apparatus.

BRIEF DESCRIPTION OF THE DRAWINGS

Further objects and advantages of the invention can be more fully understood from the following detailed description taken in conjunction with the accompanying drawings in which:

FIGS. 1 and 2 show two examples of the prior art detectors;

FIG. 3 is a front view of one embodiment of the novel light converting type detector embodying the invention;

FIG. 4 is a diagram showing the internal construction of the embodiment shown in FIG. 3;

FIG. 4A is a perspective sectional view of a portion of the embodiment shown in FIG. 3;

FIG. 10 is a side view showing the manner of measuring the potential distribution along a string insulator;

FIG. 11 is a diagrammatic representation of a modified embodiment of this invention capable of detecting electric current by using Faraday rotation;

DESCRIPTION OF THE PREFERRED EMBODIMENTS

Figure 5:
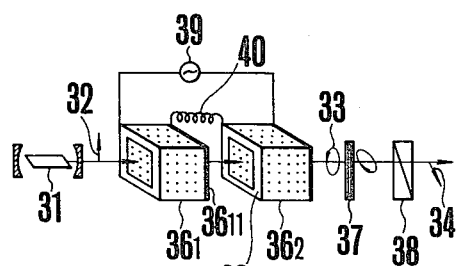
FIG. 5 is an exploded view showing the principle of operation of the photoelectric element for polarizing light in accordance with applied electric field.

With reference now to FIGS. 3 and 4 illustrating a preferred embodiment of this invention, a contact piece 21 comprising a hollow spherical metal tip is secured to the upper end of a hollow flexible insulated rod 22 made of glass fibers, for example. The contact piece 21 is used as a high voltage contact terminal. A casing 23 is mounted on the lower end of the insulating rod 22 for housing a photoamplifier, light receiving element, and a source of supply for operating the amplifier, etc., as will be described later in connection with FIG. 4. A loop band 23a is provided for the casing 23 for transportation. The casing 23 or measuring unit is provided with a display instrument 24, a grounding terminal 26 for grounding the measuring unit, and a measuring condition display device 27 including a lamp for displaying whether the measuring unit can operate normally or not. The display device is also used to display whether the detector is used to measure voltage or current as well as the measuring range. A self-testing or self-check terminal 25 is provided near the lower end of the insulating rod 22. The illustrated detector is designed to measure voltage so that it is not provided with a transfer switch for transferring the operation of the detector between current measurement and voltage measurement.

The detail of the internal construction of the detector will now be described with reference to FIG. 4. As shown, in the casing 23 are housed a semiconductor laser element 201 acting as a light source, a reflective mirror 202 for reflecting upwardly the laser beam 203 from the laser element 201 through a hollow passage in the insulating rod 22 or through a bundle of glass fibers 204 (see FIG. 4A) toward a reflector 205 contained in the hollow spherical contact piece 21 on the upper end of the insulating rod 22. The reflector 205 is made of lead glass or the like and takes the form of a prism or rod. The laser beam reflected by the reflector 205 passes through a polarizer 206 and a series of photo-electric converting elements $208_1$ through 208n which are made of high resistance crystals of $LiNbO_3$, for example, as will be described later and have a configuration of a cylindrical or rectangular rod. The polarizer 206 and photo-electric converting elements are contained in the hollow insulating rod in vertical alignment along the longitudinal axis of the insulating rod. One end of the photo-electric converting element $208_1$ is connected to the contact piece 21 through a conductor $208_1$, and adjacent photo-electric converting elements are interconnected by conductors $208_{22}$, $208_{33}$ ... $208_{nn}$, respectively. These photo-electric converting elements are contained in a flexible insulating rectangular tube 209 (see FIG. 4A) made of glass fibers, for example. The lower electrode of the lowermost photo-electric converting element 208n is connected to a suitable portion of the casing 23 through a conductor $208_{nn+1}$. Next to the lowermost element 208n are disposed a ¼ wavelength plate unit 210 and a light detector 211. A photoelectric converter 212 such as a solar cell, photodiode or a photoelectron multiplier is disposed in the casing 23 to convert the laser beam received by the photodetector 211 into an electric signal which is amplified by an amplifier 213. The output from the amplifier 213 is applied to a measuring condition set circuit 220 which is interlocked with abovementioned measuring condition display device 27 and includes a circuit for switching between current measurement and voltage measurement and for switching the measuring range. The circuit may be constructed by using well known circuit elements. The output from the measuring condition set circuit 220 is applied to a display meter 24. In the casing 23 are also provided a DC source 231 for the light converting type detector, for example a dry cell, and a source switch 232 for applying electric power to various elements of the detector. The switch 232 is mounted on the casing 23. Further, a check terminal 251 is mounted on the casing 23 which is adapted to be connected to the check terminal 25 for testing whether the detector can operate normally or not. A high voltage generator 253 comprising a DC converter type oscillator or a piezoelectric element that generates a high voltage of from several thousands to several tens thousand volts is connected between terminal 251 and a test switch 252. Accordingly, to check the operating condition of the detector, the switch 252 is closed for applying the high voltage generated by the high voltage generator 253 to the upper electrode of the lowermost photoelectric converting element 208n via terminals 25 and 251 and a conductor therebetween, not shown.

Figure 6:
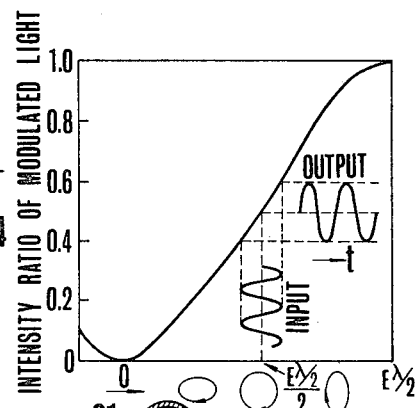
FIG. 6 shows a characteristic showing the ratio of the intensity of the polarized light to field strength of the photoelectric element utilized in the detector shown in FIG. 5.

Before describing the operation of the light converting type detector described above, the principle of a voltage or current measurement made by using light as a medium will firstly described with reference to FIGS. 5 and 6. FIG. 5 shows the principle of an external modulating system of an oscillator comprising a light source, for example a semiconductor laser element 31 capable of operating as an oscillator, photoelectric elements $36_1$ and $36_2$ operating as an external modulator, a source of high voltage AC or DC voltage 39 connected between hollow rectangular electrodes $36_{11}$ and $36_{22}$ of the photoelectric elements $36_1$ and $36_2$, a plate unit 37 for delaying one of the components of the modulated light from the photoelectric elements $36_1$ and $36_2$ by $\frac{1}{4}$ wave length ($\lambda$), and a light detector 38. The confronting ends of the electrodes $36_{11}$ and $36_{22}$ are interconnected by a conductor 40.

The laser beam from the oscillator 31 is sent to the photoelectric elements $36_1$ and $36_2$ through a polarizer (not shown) and modulated by the photoelectric elements. More particularly, where electric field or magnetic field (in FIG. 5, electric field is used) is applied to the photoelectric elements $36_1$ and $36_2$ for applying information by controlling the amplitude, phase or frequency of the laser beam, the refractive index of the elements $36_1$ and $36_2$ is varied thereby modulating the laser beam with information. The dielectric constant of certain photoelectric elements depends upon the intensity of the electric field. Accordingly, when the dielectric constant in vacuum is denoted by $\epsilon_o$, there is a relationship $n^2 = \epsilon/\epsilon_o$ between the refractive index n and the dielectric constant $\epsilon$ of the elements. Thus, where $\epsilon$ varies under impressed field, the refractive index varies also. n can be expressed by an exponential series of X as follows:

$$n = n_o + a X + b X^2$$

where $n_o$ represents the refractive index when $X = 0$ and a and b are Pockels coefficient and Kerr coefficient respectively. Accordingly, according to this principle, it is possible to convert a linearly polarized light input 32 from oscillator 31 into an elliptically polarized light 33 by the action of the photoelectric elements $36_1$ and $36_2$, which are termed as Pockels effect and Kerr effect. One component of the elliptically polarized light 33 is phase-shifted by the $\frac{1}{4}\lambda$ plate unit 37 thus producing linearly polarized light (modulated light) from the light detector 38.

Many stable and efficient materials have been developed suitable to fabricate photoelectric elements $36_1$ and $36_2$. These materials include quartz, ADP($NH_1H_2PO_4$), KDP($KH_2PO_4$), $LiTaO_3$, $ZiNbO_3$, etc. and they are classified into longitudinal type and transverse type depending upon the direction of the optical axis and the direction of application of the field. FIG. 5 shows longitudinal type elements and the relationship or ratio between the intensity of the field and the intensity of the polarized (modulated) light is shown by FIG. 6.

On the other hand, when magnetic field is applied to the photoelectric elements the plane of polarization of the light transmitting through the elements rotates in proportion to the intensity of the magnetic field. This phenomenon is called as Faraday effect, and the angle of rotation is expressed by an equation $$\theta = V \cdot l H$$

where H represents the intensity of the magnetic field in gauss, l the length of the element (dielectric) in centimeter, and the Verdet's constant related to the dielectric material.

The principle of operation of the photoelectric element described above is described in S. Saito, Y. Ohno et al paper entitled "The Laser Current Transformation for EHV Power Transmission Lines". I.E.E.E., QE-2, pages 255-259, Aug. 1966 and S. Saito, Y. Ohno et al paper entitled "Development of the Laser Current Transformer for Extra-High-Voltage Power Transmission Lines, I.E.E.E., QE-3, pages 589-597, Nov. 1967."

Operation of the light connecting type detector embodying the invention and shown in FIGS. 3 and 4 will now be described based on the principle described above. At first the source switch 232 in the measuring unit 23 is closed to apply power to various elements. Accordingly, the light source 201 is excited to emit a laser beam which reaches reflective mirror 202 through an optical system including a lens. The laser beam reflected by the reflective mirror 202 transmits through optical fiber 204 contained in the insulating rod 22 to reach reflector 205, and the laser beam reflected by the reflector 205 transmits through polarizer 206, and cascade connected photoelectric elements 208, through 208n to be modulated in accordance with the voltage to be measured.

The operation of the photoelectric elements will be described in more detail. During measurement, the contact piece 21 on the upper end of the insulating rod 22 is maintained in contact with a member whose voltage is to be measured, for example, a high voltage transmission line, and the terminal 26 is grounded. Accordingly, the voltage of the measured member is shared among n photoelectric elements cascade connected between the member and the ground, so that the laser beam transmitting through respective photoelectric elements is modulated by the fractional voltages across respective photosensitive elements, with the result that the linearly polarized laser beam is polarized elliptically in accordance with respective fractional voltages. The laser beam transmitting through the lowermost photoelectric element 208n arrives at the photoelectric converting element 212 through $\frac{1}{4}\lambda$ plate unit 210, light detector 211 and a lens system, whereby the laser beam is converted into an electric signal. The output from the photoelectric converting element 212 is sent to a display meter 24 through amplifier 213 and the measuring condition setting circuit 220, thus displaying the voltage measured.

The method of checking the light converting type detector is as follows. Usually, such checking operation is performed prior to the use of the detector by using a predetermined high voltage. More particularly, check terminals 25 and 251 are interconnected by a conductor, not shown, and the grounding terminal 26 is grounded. Thereafter, switches 232 and 252 are closed sequentially to apply the predetermined high voltage (for example, 1000 V) generated by the high voltage generator 253 to one photoelectric element 208n via terminals 25 and 251. Then the laser beam generated by the semiconductor laser element 201 is modulated by the photoelectric element 209n and the laser beam thus modulated is converted into an electric signal by the photoelectric converter 212. The signal is sent to the display meter 24 via photoelectric converting element 212 for displaying the voltage of the predetermined value. Should the displayed value is different from a prescribed value, the operation of the detector is abnormal thus indicating that calibration or repair is necessary.

Figure 7:
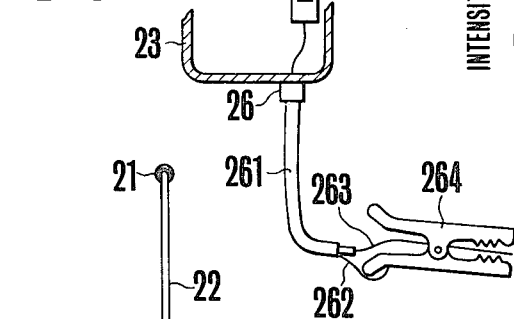
FIG. 7 shows one example of the grounding terminal shown in FIG. 4.

Another checking method is to determine whether the grounding terminal 26 has been grounded or not before using the detector. Since the voltage to be measured by the detector amounts to several thousands to several hundreds thousand volts there will be a danger of electric shock to the operator unless the detector is positively grounded. To eliminate this difficulty, in the detector shown in FIG. 7, an electroconductive clip 264 is secured to one end of a conductor 261 extending from the grounding terminal 26 of the detector. The conductor 261 comprises parallel conductors or a coaxial cable, one serving as the grounding conductor 262 for the detector and the other as the grounding conductor 263 for DC source 231. These conductors are connected to the clip 264 so that when the clip clamps a grounded body the power from the DC source 231 is supplied to various elements of the measuring unit 23.

In the foregoing embodiment, for simplification of description, the clip 264 is employed which clamps a grounded body (not shown) so as to connect grounding conductors 262 and 263. However, it is not a general practice to use the clip 264 under the application of high voltage and, actually, respective conductors are securedly connected to the grounded body with screws.

The light converting type detector of this invention has the following advantages:

According to this invention, the voltage of a high voltage transmission line, for example, or the potential difference between a charged body and the ground is measured by utilizing the fact that the light transmitting through a photoelectric element is modulated in accordance with the voltage impressed upon the element so that not only the construction of the detector but also the reading of the measured value are simple.

Moreover, as a plurality of photoelectric elements of the number determined by the voltage to be measured are cascade connected, the voltage to be measured is not impressed directly upon the measuring unit thus decreasing the danger of electric shock.

Further, the detector of this invention is constituted by two major component parts, that is the measuring unit. 23 and the insulating rod 22 and since the circuit construction of the measuring unit 23 is relatively simple and can be driven by a battery, it is possible to construct the detector as a portable unit. Further, it is possible to make the weight of the detector to be substantially equal or smaller than that of the conventional detector. Even when any element of the detector may become faulty, it is still fail safe. For example, even when any one of the photoelectric element becomes faulty, the high voltage will not be applied to the measuring unit.

Figure 8:
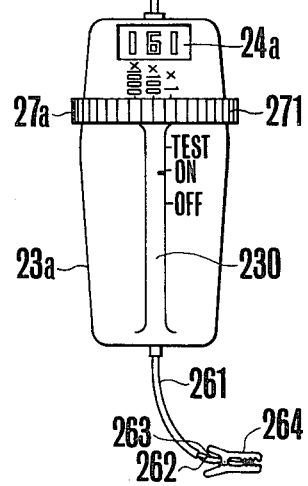
FIG. 8 is a front view of a modified embodiment of this invention.
Figure 9:
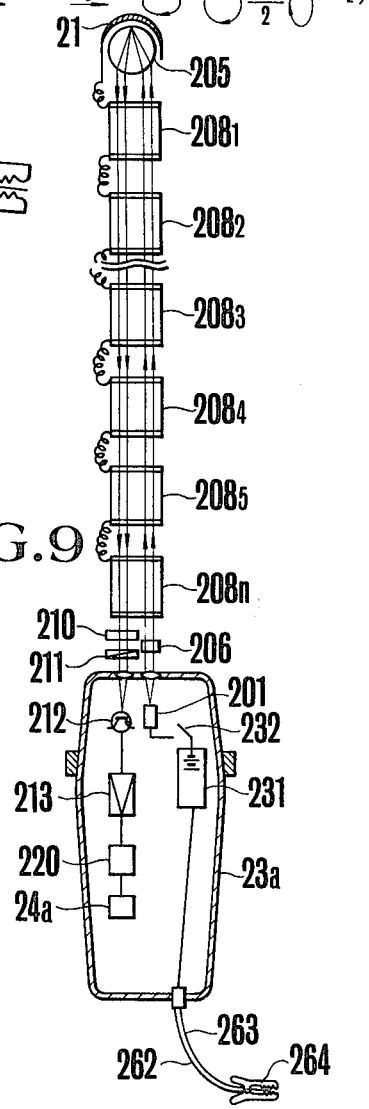
FIG. 9 shows the internal construction of the modified embodiment shown in FIG. 8.

FIGS. 8 and 9 show a modified embodiment of this invention which is different from that shown in FIGS. 3 and 4 in that in the latter embodiment, the photoelectric elements are arranged to transmit only the reflected light whereas in the modified embodiment, they are arranged to transmit both the projected light and the reflected light. Thus, in the embodiment shown in FIGS. 3 and 4, the polarized 206 is located beneath the reflector 205 whereas in the modification shown in FIGS. 8 and 9, the polarizer 206 is located at the lower end of the insulating rod so as to directly receive the laser beam from the laser beam generator 201 through a lens system. As a result, the laser beam transmitting through the polarizer arrives at the reflector 205 through photoelectric elements $208_n$ through $208_1$ and again transmits through the photosensitive elements in the opposite direction. However, the projected beam and the reflected beam transmit through different portions of respective photoelectric elements. In this embodiment, the beam transmitting through light detector 211 and a lens system is converted into an electric signal by photoelectric converting element 212 and the electric signal is applied to display meter 24a through the measuring condition setting circuit 220 for providing a digital display. Such digital display meter 24a is well known in the art so that its detailed description is believed unnecessary. As shown in FIG. 8 the measuring unit 23a is constructed to be handled more readily, and the measuring condition display device 27a is constituted by a slidable and rotatable switch knob 271 encircling the measuring unit 23a. Further, switches 232 and 252 shown in FIG. 2 are combined into a single slide switch 230 having a plurality of switching positions. In the embodiment shown in FIGS. 8 and 9, the checking circuit shown in FIG. 4 is not shown.

With this construction since the projected laser beam and the reflected laser beam transmit through the photoelectric elements it is possible to improve the sensitivity of polarization.

FIG. 10 shows another embodiment of the light converting type detector of this invention, which is used to measure a fraction of a high voltage impressed across a string insulator, that is the potential distribution across one insulator. In FIG. 10, reference numeral 410 designates a light such as an incandescent lamp utilized in combination with a reflector 402. The light emitted by the light generator 401 transmits through a lens 403 and the insulating rod, not shown. Advantageously, the light should be a coherent light, that is a laser beam. The projected light is reflected backwardly by a prism 405 mounted near the upper end of the insulating rod and then transmits through a polarizer 406 and a photoelectric element 407 (a crystal transverse to the optical axis), operating in a manner described in connection with FIGS. 5 and 6. The return light then transmits through a light detector 408 and converted into an electric signal by a photoelectric converting element 409 (solar cell, for example). The electric signal is amplified by an amplifier 410 and then applied to a display meter 411. The voltage to be measured is applied across the photoelectric element 407 through bifurcated contact pieces 415 and 416 and lead wires 413 and 414 extending through an insulating bushing 412. Accordingly, the reflected light beam will be modulated by the applied voltage. The high voltage of the transmission line 426 is distributed along respective insulators 421, 422, 423 and 424 thus creating lines of force 425. Accordingly, when the contact pieces 415 and 416 are contacted with the opposite ends of the insulator 423, the voltage shared thereby is displayed by the meter 411. Of course, the member of the photoelectric elements 407 may be varied in accordance with the magnitude of the voltage to be measured.

It is also possible to measure the voltage distribution of a charged member for example the voltage distribution of each insulator of a string insulator or the voltage distribution of the bushing of high voltage machines and apparatus.

Although bifurcated contact pieces 415 and 416 have been described as extending from the insulating bushing 412 perpendicular to the optical axis (extending vertically as viewed in FIG. 10), the contact pieces may be arranged in parallel with the optical axis thereby to assure easy operation from the ground.

FIG. 11 shows still another embodiment of this invention suitable to measure current I flowing through a conductor 430. The light emitted by a light source 431 including a reflector 432 transmits through a polarizer 433 to form a coherent light beam having a polarizing angle $\theta=0$ as shown by 435. The light from the source 431 passes through a Faraday-rotator 437 made of lead glass, for example, and also acting as a prism. While transmitting through the Faraday rotator 437, the light is caused to undergo Faraday rotation by the magnetic field 438 produced by the line current I so as to have a rotation angle $\theta'$ as shown by 439. The polarized light transmits through a light detector 440 and is then converted into an electric signal by a photoelectric element 441. The electric signal is displayed by a display meter 443 after being amplified by an amplifier 442. In this manner it is possible to measure the line current I. In this invention, it is only necessary to receive the line conductor 430 in a groove 445 provided for the Faraday rotator 437.

This modification operates according to equation 2. More particularly, it is possible to readily pick up the current I by the magnetic field produced thereby. In this case, equation (2) is modified as follows:

$$\theta = V \cdot NI$$

When lead glass rotator is used, $V=3.2\times10^{-5}$ rad/AT, where N represents the number of turns of the conductor linking the light path. In the arrangement shown in FIG. 11 N=0.3T. To rotate the light by $\theta=60°$, a current of 30000AT is necessary. In FIG. 11 lines crossing the light shows the Faraday rotation. The construction of this embodiment can eliminate insulation problem and has excellent transient response. The response characteristic is flat from direct current to high frequencies up to several mega Hz. Further, as the Faraday rotator is made of lead glass there is no problem caused by temperature variation and no adverse effect caused by magnetic saturation.

Where it is desired to provide a safety check circuit for the embodiment shown in FIG. 11, the high voltage generator 253 shown in FIG. 4 is replaced by a current coil and the check terminal 251 is connected to a point to be measured.

With the embodiment shown in FIG. 11 it is possible to measure the current flowing through a high voltage line by merely contacting the Faraday rotator against the line without using a magnetic core linking the line.

When a current transformer (element 437) shown in FIG. 11 is combined with a transformer (element 208 or 407) shown in FIG. 4 or 10 it is possible to measure current by the polarizing angle and voltage by the plane of polarization. More particularly, the linearly polarized laser beam is converted into circularly polarized light by the $\lambda/4$ plate unit which is then transformed into linearly polarized light by a Nicol prism when this linearly polarized light is transmitted through a Faraday rotator made of lead glass the angle of polarization is rotated by the Faraday effect thus making it possible to measure current. After rotating 45° the plane of polarization, the $(45°+\theta)$ linearly polarized light is transmitted through the photoelectric element 407 in the direction of the Z axis thereof while at the same time, electric field is also applied in the direction of the Z axis. After transmitting through the element 407, a phase difference is created in the direction of the major oscillation whereby the laser beam changes from linear polarization to circular polarization.

Figure 12:
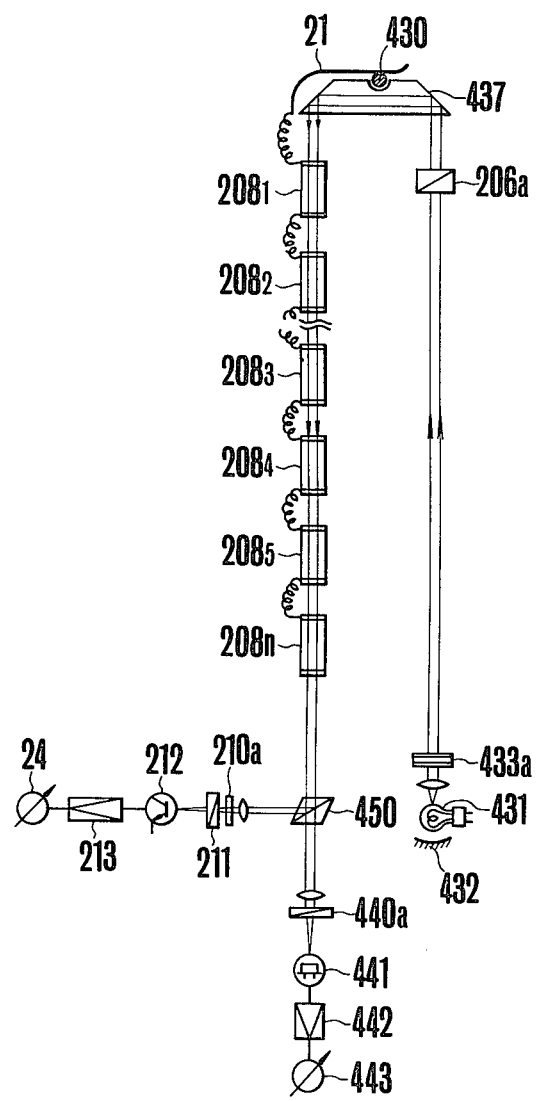
FIG. 12 is a side view of still another modification of this invention capable of measuring both voltage and current.
Figure 13:
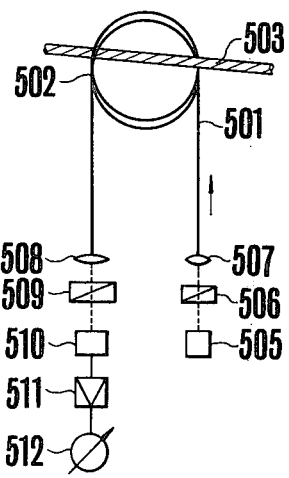

As will be seen from the foregoing description, it is possible to detect the voltage and the current accurately without influence by the interaction between them by means of combining FIG. 4 or 10 with FIG. 11. Specifically, FIG. 12 shows a schematic diagram of a system for measuring the voltage and the current by means of combining FIG. 4 with FIG. 11. In the figure, numeral 450 designates a half-mirror, 433 a $\lambda/4$ wavelength plate unit, 206a Nicol prism with polarizing angle set to 45 degrees, 210a a $\lambda/4$ wavelength plate unit, 211 a Nicol prism with polarizing angle set to 45 degrees and 440a a Nicol prism with polarizing angle set to zero degrees, where component units of FIG. 11 are combined with those of FIG. 4. The operation of each part of FIG. 12 is the same as described with reference to either FIG. 4 or FIG. 11 and hence an operational description of FIG. 12 is not given herein.

In addition to the laser beam generator, luminous diode or a gas laser for example He-Ne laser which are constructed to emit conherent light or even an ordinary light may be used as the source of light.

In summary, according to this invention use is made of a photoelectric element whose optical characteristic is varied by electric field or magnetic field for modulating light by the potential difference or the potential distribution between a charged body and a body at the ground potential or by the current flowing through a high voltage conductor, electric machines or apparatus, and the modulated light is measured on the ground. Accordingly, it is easy to safely measure voltage or current. Further, as light is used as the medium for transmitting an information, and as the light path, contact piece and photoelectric element are supported by an insulating rod, it is possible to safeguard the operator against electric shock. Moreover, a high voltage generator or a current coil is contained in a measuring unit it is possible to safely check the condition of the detector.

Although the invention has been shown and described in terms of some preferred embodiments thereof, it should be understood that many changes and modifications will be obvious to one skilled in the art without departing the true spirit and scope of the invention as defined in the appended claims.

What is claimed is:

1. A portable self-contained light converting type high tension detector adapted to be carried by an operator and applied to high tension conductors without danger to the operator comprising an elongated insulating tube, a housing supporting said tube at one end thereof, a source of light located in said housing beneath said one end of said insulating tube, a reflector mounted on the upper end of said tube, means for projecting the light emitted by said source of light through said tube and upon said reflector to cause the same to reflect back said projected light, a polarizer in the path of said projected light for polarizing the reflected light, a photoelectric means at the top end of said tube contained in and optically aligned along said tube for modulating the polarized light in accordance with an electric quantity to be measured, said photoelectric means comprising a dielectric block having spaced conductive end plates which permit passage of light through said end plates and the dielectric block therebetween, means located on the top of said tube and operable by approaching a high tension member for sensing said electric quantity from a charged high tension member and for applying said electric quantity to the top end plate of said dielectric block, means for connecting the bottom end plate of said dielectric block of a reference potential such that a predetermined portion of the high tension on said member is applied across said dielectric block by said end plates, said dielectric block conductively isolating and physically spacing the elements in said housing from said high tension member, means located beneath said tube in said housing for converting said modulated light produced by said photoelectric element into an electric signal in accordance with the modulation, and means responsive to said electric signal for displaying a representation of said electric quantity.

2. The detector according to claim 1 wherein said photoelectric means comprises a plurality of aligned cascade connected dielectric blocks each with conductive end plates and conductive connections between the intermediate end plates of adjacent dielectric blocks such that the bottom end plate of the bottom dielectric block is connected to substantially ground potential whereby said reflected light is elliptically polarized by passing through said dielectric blocks sequentially and the elements in said housing are conductively isolated and physically spaced from said high tension member by a plurality of said dielectric blocks.

3. The detector according to claim 1 wherein said source of light comprises a laser element for emitting a laser beam.

4. The detector according to claim 1 wherein said means for sensing the electric quantity comprises a contact piece which is contacted to said charged member for measuring the potential difference between said charged member and the ground.

5. The detector according to claim 4 wherein said contact piece takes the form of bifurcated contacts adapted to contact the opposite ends of a charged member for measuring the potential distribution thereacross.

6. A light converting type detector according to claim 1 and including a grounded casing containing said source of light, and said display means.

7. The detector according to claim 1 wherein said polarizer and said photoelectric means are contained in a flexible insulating tube, said reflector and said means for sensing the electric quantity to be measured are mounted on the upper end of said insulating tube and a measuring unit including a grounded casing containing said source of light, said means for converting the modulated light into an electric signal and said display means is connected to the lower end of said insulating tube.

8. The detector according to claim 1 wherein said plurality of photoelectric elements is contained in a first insulating tube, said light projecting means comprises a glass fiber light guide and said first insulating tube and said glass fiber light guide is contained in a second flexible insulating tube.

9. The detector according to claim 1 which further comprises means located between said photoelectric element and said means for converting the modulated light into an electric signal for delaying said modulated light by ¼ wavelength of said light.

10. The detector according to claim 7 which further comprises a source of high voltage contained in said casing and means for applying the high voltage from said source across said photoelectric means for testing the operating condition of said detector.

11. The detector according to claim 7 wherein said measuring unit further comprises a measuring condition setting circuit connected between said means for converting the modulated light into an electric signal and said display means.

12. The detector according to claim 1 wherein said polarizer is located between said reflector and said photoelectric element so as to linearly polarize the light reflected by said reflector.

13. The detector according to claim 1 wherein said polarizer is located between said source of light and said photoelectric means, and said photoelectric means is constructed to transmit the polarized light both to and from said reflector.

14. A portable self-contained light converting type high tension detector comprising an elongated insulating tube, a housing supporting said tube at one end thereof, a source of light located in said housing beneath said one end of said insulating tube, a prism reflector means mounted on the upper end of said tube, means for projecting the light emitted by said source of light through said tube and upon said reflector means to cause the same to reflect back said projected light, a polarizer for linearly polarizing the light, said prism reflector comprising a Faraday rotator for modulating the polarized light in accordance with an electric current to be measured, wherein said Faraday rotator has the form of a prism reflector with an input end and an output end forming two reflecting surfaces to retroreflect light back down said tube and a recess for receiving a conductor for applying a magnetic field representative of the current in said conductor to said Faraday rotator causing said polarized light to undergo Faraday rotation as it passes through said rotator from its input end to its output end, said prism operable by approaching a high tension member carrying electric current for applying the field of said electric current to said Faraday rotator, photoelectric converting means for converting the rotated light into an electric signal and means responsive to said electric signal for displaying said measured current.

15. The detector according to claim 14 wherein said Faraday rotator takes the form of a frustum having opposing inclined end surfaces for reflecting the light and a groove on the upper surface for receiving a current carrying conductor thereby subjecting the light to the action of magnetic field produced by said current about said conductor.

16. The detector according to claim 14 which further comprises a plurality of cascade connected photoelectric elements disposed between said Faraday rotator and said photoelectric converting means, and a contact piece adapted to engage said current carrying conductor for applying the voltage of said conductor to said photoelectric elements thereby measuring said current and voltage.

17. A portable light converting type detector comprising a housing supporting an elongated dielectric tube at one end with the remote end of said tube spaced a substantial distance from said housing, a Faraday rotator at said remote end, light source means at said one end directing a light beam to said Faraday rotator, a polarizer located in said light beam between said light source means and said Faraday rotator means for applying a magnetic field representative of the current to be measured to said Faraday rotator for modulating the polarized light in accordance with the current to be measured, said Faraday rotator acting also as a reflector to return said light beam through said tube toward said housing, means at said remote end for sensing the voltage to be measured, a plurality of cascade connected photoelectric elements in said tube for modulating the light reflected by the Faraday rotator in accordance with the sensed voltage, said photoelectric elements being in the form of dielectric blocks with spaced electrodes which conductively isolate and physically separate said housing from said remote end, a partial reflector located at said one end for dividing the modulated light into two portions, and means located at said one end responsive to one portion of said modulated light for displaying the current, and responsive to the other portion for displaying the voltage.

18. Apparatus according to claim 17 and including a source of high voltage contained in said housing and means selectively operable for applying the high voltage from said source across at least one of said dielectric blocks for testing the operating and measuring condition of said detector.

* * * * *